(12) United States Patent
Kim et al.

(10) Patent No.: US 10,897,017 B2
(45) Date of Patent: Jan. 19, 2021

(54) DISPLAY DEVICE HAVING A PASSIVATION FILM SURROUNDING A SUBSTRATE AND METHOD FOR MANUFACTURING THE SAME

(71) Applicant: LG Display Co., Ltd., Seoul (KR)

(72) Inventors: MinSeok Kim, Osan-si (KR); UnJung Kim, Paju-si (KR); JiHun Song, Paju-si (KR)

(73) Assignee: LG DISPLAY CO., LTD., Seoul (KR)

(*) Notice: Subject to any disclaimer, the term of this patent is extended or adjusted under 35 U.S.C. 154(b) by 13 days.

(21) Appl. No.: 16/049,425

(22) Filed: Jul. 30, 2018

(65) Prior Publication Data

US 2019/0036050 A1 Jan. 31, 2019

(30) Foreign Application Priority Data

Jul. 31, 2017 (KR) .......................... 10-2017-0097344

(51) Int. Cl.
*H01L 51/00* (2006.01)
*H01L 27/32* (2006.01)
(Continued)

(52) U.S. Cl.
CPC ...... *H01L 51/0097* (2013.01); *H01L 27/3244* (2013.01); *H01L 51/003* (2013.01); *H01L 51/5246* (2013.01); *H01L 51/5253* (2013.01); *H01L 51/56* (2013.01); *B32B 7/12* (2013.01); *B32B 27/281* (2013.01);
(Continued)

(58) Field of Classification Search
CPC .......................... H01L 51/0097; H01L 23/564
See application file for complete search history.

(56) References Cited

U.S. PATENT DOCUMENTS

2004/0150319 A1* 8/2004 Tomimatsu ......... H01L 27/3246
313/495
2011/0291544 A1 12/2011 Wei et al.
(Continued)

FOREIGN PATENT DOCUMENTS

KR 10-2015-0025947 A 3/2015

*Primary Examiner* — Lex H Malsawma
*Assistant Examiner* — Laura M Dykes
(74) *Attorney, Agent, or Firm* — Seed IP Law Group LLP

(57) ABSTRACT

A display device and a method for manufacturing the same are disclosed, in which excitation and side permeability of a flexible substrate are minimized to prevent defects of a display panel from occurring. The display device comprises a first substrate; a buffer layer arranged on the first substrate; a pixel array layer arranged on the buffer layer; and an encapsulation layer covering the pixel array layer, wherein the buffer layer surrounds a front surface and a side of the first substrate. The method for manufacturing a display device comprises the steps of preparing a supporting substrate; forming a plurality of first substrates spaced apart from one another on the supporting substrate; forming a buffer layer covering the plurality of first substrates; forming a pixel array layer on an area of the buffer layer overlapped with each of the plurality of first substrates; forming an encapsulation layer covering the pixel array layer; and forming a plurality of display panels by cutting the supporting substrate and the buffer layer based on cutting lines defined among the plurality of first substrates.

15 Claims, 11 Drawing Sheets

(51) Int. Cl.
*H01L 51/52* (2006.01)
*H01L 51/56* (2006.01)
*B32B 27/28* (2006.01)
*B32B 7/12* (2006.01)

(52) U.S. Cl.
CPC . *B32B 2307/412* (2013.01); *B32B 2307/7265* (2013.01); *B32B 2457/206* (2013.01); *H01L 51/5243* (2013.01); *H01L 2227/326* (2013.01); *H01L 2251/5338* (2013.01); *H01L 2251/566* (2013.01)

(56) References Cited

U.S. PATENT DOCUMENTS

| | | | |
|---|---|---|---|
| 2012/0319572 A1* | 12/2012 | Lee | H01L 51/524 313/512 |
| 2015/0280172 A1 | 10/2015 | Nishinohara et al. | |
| 2016/0141552 A1* | 5/2016 | Chen | H01L 51/5253 257/40 |
| 2017/0040569 A1 | 2/2017 | Watabe et al. | |
| 2017/0179422 A1* | 6/2017 | Jung | H01L 27/3276 |

* cited by examiner

DISPLAY DEVICE HAVING A PASSIVATION FILM SURROUNDING A SUBSTRATE AND METHOD FOR MANUFACTURING THE SAME

CROSS REFERENCE TO RELATED APPLICATIONS

This application claims the benefit of the Korean Patent Application No. 10-2017-0097344 filed on Jul. 31, 2017, which is hereby incorporated by reference for all purposes as if fully set forth herein.

BACKGROUND

Technical Field

The present disclosure relates to a display device and a method for manufacturing the same.

Description of the Related Art

Recently, with the advancement of the information age, a display field for processing and displaying large amounts of information has been rapidly developed. In response to this trend, various display devices have been developed and used. Among such display devices, there is a trend that liquid crystal display (LCD) devices and organic light emitting display (OLED) devices having excellent properties of a thin profile, a light weight, and low power consumption have been widely used.

Such a display device includes a display panel comprised of a substrate. In this case, since a glass substrate is generally used to withstand high heat generated during a manufacturing process, there is a limitation in making properties of a thin profile, a light weight, and flexibility. Therefore, a flexible display device manufactured using flexible materials such as plastic instead of an inflexible glass substrate to maintain the same display property even when being bent like a paper has recently emerged as a display device for a new generation and its research and development is actively in progress.

In order to manufacture the flexible display device, after a display element forming process for forming a display element such as a thin film transistor on a large area of the flexible substrate on a basis of unit area is performed, a cutting process for cutting the substrate on a basis of a cell unit is required. After a flexible substrate is formed on a support substrate made of glass or quartz material due to well-flexible property of the flexible substrate and is cut on a basis of a cell unit, the flexible substrate is separated from a base substrate, whereby the flexible display device is completed.

However, in the process of cutting the flexible substrate and the base substrate on a basis of a cell unit, defects of a display panel such as excitation of the flexible substrate and side permeability of the flexible substrate may be caused due to a difference in a margin between the process of cutting the flexible substrate and the process of cutting the base substrate.

BRIEF SUMMARY

Accordingly, the present disclosure is directed to a display device and a method for manufacturing the same, which substantially obviate one or more problems due to limitations and disadvantages of the related art.

An advantage of the present disclosure is to provide a display device and a method for manufacturing the same, in which excitation and side permeability of a flexible substrate are minimized to prevent defects of a display panel from occurring.

Additional advantages and features of the disclosure will be set forth in part in the description which follows and in part will become apparent to those having ordinary skill in the art upon examination of the following or may be learned from practice of the disclosure. The objectives and other advantages of the disclosure may be realized and attained by the structure particularly pointed out in the written description and claims hereof as well as the appended drawings.

To achieve these objects and other advantages and in accordance with the purpose of the disclosure, as embodied and broadly described herein, a display device according to the present disclosure comprises a first substrate; a buffer layer arranged on the first substrate; a pixel array layer arranged on the buffer layer; and an encapsulation layer covering the pixel array layer, wherein the buffer layer surrounds a front surface and a side of the first substrate.

In another aspect of the present disclosure, a method for manufacturing a display device comprises the steps of (A) preparing a supporting substrate; (B) forming a plurality of first substrates spaced apart from one another on the supporting substrate; (C) forming a buffer layer covering the plurality of first substrates; (D) forming a pixel array layer on an area of the buffer layer overlapped with each of the plurality of first substrates; (E) forming an encapsulation layer covering the pixel array layer; and (F) forming a plurality of display panels by cutting the supporting substrate and the buffer layer based on cutting lines defined among the plurality of first substrates.

It is to be understood that both the foregoing general description and the following detailed description of the present disclosure are exemplary and explanatory and are intended to provide further explanation of the disclosure as claimed.

BRIEF DESCRIPTION OF THE SEVERAL VIEWS OF THE DRAWINGS

The accompanying drawings, which are included to provide a further understanding of the disclosure and are incorporated in and constitute a part of this application, illustrate embodiment(s) of the disclosure and together with the description serve to explain the principle of the disclosure. In the drawings.

DETAILED DESCRIPTION

Figure 1:
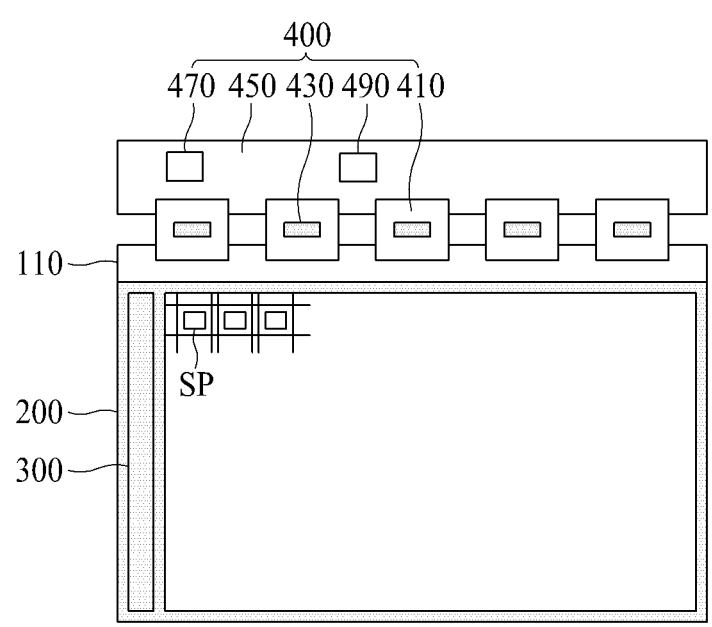
FIG. 1 is a view illustrating a display device according to one embodiment of the present invention.

Advantages and features of the present disclosure, and implementation methods thereof will be clarified through following embodiments described with reference to the accompanying drawings. The present disclosure may, however, be embodied in different forms and should not be construed as limited to the embodiments set forth herein. Rather, these embodiments are provided so that this disclosure will be thorough and complete, and will fully convey the scope of the present disclosure to those skilled in the art. Further, the present disclosure is only defined by scopes of claims.

A shape, a size, a ratio, an angle, and a number disclosed in the drawings for describing embodiments of the present disclosure are merely an example, and thus, the present disclosure is not limited to the illustrated details. Like reference numerals refer to like elements throughout. In the following description, when the detailed description of the relevant known function or configuration is determined to unnecessarily obscure the important point of the present disclosure, the detailed description will be omitted.

In a case where 'comprise', 'have', and 'include' described in the present specification are used, another part may be added unless 'only~' is used. The terms of a singular form may include plural forms unless referred to the contrary.

In construing an element, the element is construed as including an error range although there is no explicit description.

In describing a position relationship, for example, when the position relationship is described as 'upon~', 'above~', 'below~' and 'next to~', one or more portions may be arranged between two other portions unless 'just' or 'direct' is used.

In describing a time relationship, for example, when the temporal order is described as 'after~', 'subsequent~', 'next~', and 'before~' a case which is not continuous may be included unless 'just' or 'direct' is used.

It will be understood that, although the terms "first", "second", etc. may be used herein to describe various elements, these elements should not be limited by these terms. These terms are only used to distinguish one element from another element. Therefore, a first element mentioned hereinafter could be termed a second element, without departing from the scope of the present disclosure.

"A first horizontal-axis direction", "a second horizontal-axis direction" and "a vertical-axis direction" should not be construed by a geometric relation only of a mutual vertical relation, and may have broader directionality within the range that elements of the present disclosure may act functionally.

It should be understood that the term "at least one" includes all combinations related with one or more items. For example, "at least one among a first item, a second item and a third item" may include all combinations of two or more items selected from the first, second and third items as well as each item of the first, second and third items.

Features of various embodiments of the present disclosure may be partially or overall coupled to or combined with each other, and may be variously inter-operated with each other and driven technically as those skilled in the art can sufficiently understand. The embodiments of the present disclosure may be carried out independently from each other, or may be carried out together in co-dependent relationship.

Hereinafter, the preferred embodiments of the present disclosure will be described in detail with reference to the accompanying drawings. In adding reference numerals to elements of respective drawings, it is to be understood that the same reference elements may have the same reference numerals if possible even though the same reference elements are shown on different drawings.

FIG. 1 is a view illustrating a configuration of a display device according to one embodiment of the present invention.

Referring to FIG. 1, the light emitting diode display apparatus according to this embodiment includes a first substrate 110, and a second substrate 200.

The first substrate 110 is a thin film transistor array substrate, and may be made of a glass or plastic material.

The first substrate 110 according to one example includes a plurality of pixels SP.

Each of the plurality of pixels SP is a minimum unit area where light is actually emitted, and may be defined as a sub pixel. At least three adjacent pixels SP may constitute one unit pixel for color display. For example, one unit pixel may include a red pixel, a green pixel and a blue pixel, which are adjacent to one another, and may further include a white pixel for improvement of luminance.

The second substrate 200 is arranged to cover the first substrate 110, and may be defined as an opposing substrate, a color filter array substrate, or an encapsulation substrate. The second substrate 200 may be bonded to the first substrate 110 by a sealant.

Additionally, the light emitting diode display apparatus according to one example of the present invention further includes a gate driving circuit 300, and a panel driver 400.

The gate driving circuit 300 generates a gate pulse in accordance with a gate signal input from the panel driver 400 and supplies the generated gate pulse to the gate line. The gate driving circuit 300 according to one example is built in the third non-display area of the first substrate 110 by the same process as that of the thin film transistor provided in each pixel SP. For example, the gate driving circuit 300 may be provided in, but not limited to, the non-display area at a left side and/or right side of the display area. The gate driving circuit 300 may be provided in a random non-display area that may supply a gate pulse to the gate line.

Selectively, the gate driving circuit 300 may be manufactured in the form of a driving integrated circuit. In this case, the gate driving circuit 300 according to one example may be packaged in the third and/or fourth non-display area of the first substrate 110 to be connected with the plurality of gate lines one to one. The gate driving circuit 300 according to another example may be packaged in a gate flexible circuit film. In this case, the gate flexible circuit film may be attached to a gate pad portion provided in the third and/or fourth non-display area of the first substrate 110, whereby the gate driving circuit 300 may be connected to the plurality of gate lines through the gate flexible circuit film and the gate pad portion one to one.

The panel driver 400 is connected to the pad portion provided in the first non-display area of the first substrate 110 and displays an image corresponding to image data supplied from a display driving system on the display area. The panel driver 400 according to one example includes a plurality of data flexible circuit films 410, a plurality of data driving integrated circuits 430, a printed circuit board 450, a timing controller 470, and a power circuit 490.

Each of the plurality of data flexible circuit films 410 is attached to the pad portion of the first substrate 110 by a film attachment process.

Each of the plurality of data driving integrated circuits 430 is individually packaged in each of the plurality of data flexible circuit films 410. The data driving integrated circuit 430 receives pixel data and data control signal provided from the timing controller 470, converts the pixel data to an analog type data voltage per pixel in accordance with the data control signal, and supplies the converted data voltage to the corresponding data line.

The printed circuit board 450 is connected with the plurality of data flexible circuit films 410. The printed circuit board 450 supports the timing controller 470 and the power circuit 490, and serves to deliver a signal and a power source between elements of the panel driver 400.

The timing controller 470 is packaged in the printed circuit board 450, and receives image data and a timing synchronization signal provided from the display driving system through a user connector provided in the printed circuit board 450. The timing controller 470 generates pixel data by aligning the image data to be suitable for a pixel arrangement structure of the display area on the basis of the timing synchronization signal, and provides the generated pixel data to the data driving integrated circuit 430. Also, the timing controller 470 controls each driving timing of the plurality of data driving integrated circuits 430 and the gate driving circuits 300 by generating each of the data control signal and the gate control signal on the basis of the timing synchronization signal.

The power circuit 490 is packaged in the printed circuit board 450, generates various voltages required to display an image on the display area by using externally input power source and supplies the generated voltages to the corresponding element.

Additionally, the panel driver 400 may further include a control board connected to the printed circuit board 450. In this case, the timing controller 470 and the power circuit 490 are packaged in the control board without being packaged in the printed circuit board 450. Therefore, the printed circuit board 450 serves to deliver a signal and a power source between the plurality of data flexible circuit films 410 and the control board.

Figure 2:
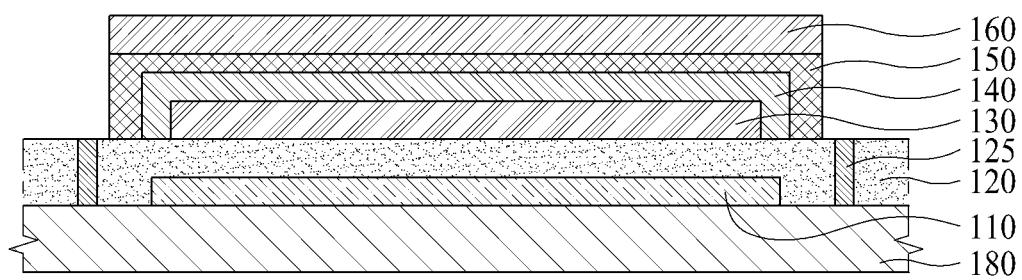
FIG. 2 is a cross-sectional view illustrating a display device according to one embodiment of the present disclosure.

FIG. 2 is a cross-sectional view illustrating a display device according to one embodiment of the present disclosure.

Referring to FIG. 2, the display device according to one embodiment of the present disclosure displays an image corresponding to a data signal provided from a driving circuit, and comprises a first substrate 110, a buffer layer 120, a passivation film 125, a pixel array layer 130, an encapsulation layer 140, a second substrate 160, and a light-transmitting film 180.

The first substrate 110 is a base substrate, and may include a plastic material. In this case, if the first substrate 110 includes a plastic material, the first substrate 110 may include an opaque or colored polyimide material. For example, the first substrate 110 made of a polyimide material may be a hardened polyimide resin coated with a constant thickness on a front surface of a delamination layer arranged on a supporting substrate which is relatively thick. In this case, the supporting substrate is separated from the first substrate 110 by delamination of the delamination layer using a laser delamination process.

The buffer layer 120 is arranged on the first substrate 110. The buffer layer 120 according to one embodiment serves to prevent water from being permeated into the first buffer layer 120 and the pixel array layer 130. The buffer layer 120 may be made of an inorganic insulating material, for example, but not limited to, a silicon dioxide ($SiO_2$), a silicon nitride (SiNx) or a multi-layer of $SiO_2$ and SiNx.

The buffer layer according to one embodiment is formed to surround a front surface and all exposed sides of the first substrate 110. In this case, the front surface is a surface facing an upper surface and is a surface closest to the second substrate 160 from the first substrate 110. If the buffer layer 120 is formed to cover only the front surface of the first substrate 110, permeability to the side of the first substrate 110 occurs, which causes a defect of the display panel. However, since the buffer layer 120 according to one embodiment is formed to surround even the side of the first substrate 110, side permeability of the first substrate 110 may be avoided, whereby the defect of the display panel may be prevented from occurring.

As can be appreciate, the first substrate 110 is in the form of rectangular cube, also called a rectangular prism. As such, it has six sides, the front and back sides and the sidewalls that extend between the front and back sides. The buffer layer will surround five of these six walls. In a preferred embodiment, the buffer layer is in abutting contact with each of the five sides, which may also be call surfaces of the first substrate 110.

The passivation film 125 is formed at the side of the first substrate 110. The passivation film 125 according to one embodiment may be made of an inorganic material or metal material. The passivation film 125 may be formed with the same height as that of the buffer layer 120 surrounding the side of the first substrate 110. The passivation film 125 according to one embodiment may prevent side permeability of the first substrate 110 from occurring like the buffer layer 120, and may serve as s dam that prevents particles such as dust from being permeated into the first substrate 110.

Since the buffer layer 120 according to one embodiment may protect the first substrate 110 together with the passivation film 125, a defect ratio of the display panel may be reduced remarkably, and therefore reliability of the display device may be improved.

The pixel array layer 130 is arranged on the buffer layer 120 and includes a plurality of pixels for displaying an image. The plurality of pixels according to one embodiment may include various kinds of elements such as a thin film transistor, a light emitting diode, a pixel electrode, etc., to constitute the display device according to the present disclosure. The plurality of pixels are minimum unit of areas from which a light is emitted and each comprise a light emitting diode emitting light based on a pixel driving power source provided from a driving power line. The light emitting diode according to one embodiment may be an organic light emitting diode OLED, and light generated from the organic light emitting diode is emitted to the outside to display an image.

The encapsulation layer 140 is formed to cover the pixel array layer 130 to prevent water permeation to each pixel and protect the light emitting diode vulnerable to external water or oxygen. The encapsulation layer 140 according to one embodiment may be formed of an inorganic material or organic material, or may be formed of a deposition structure where an inorganic material and an organic material are deposited alternately.

The second substrate 160 is arranged on the encapsulation layer 140 to protect the entire light emitting diode assembly, such as the encapsulation layer 140. The second substrate 160 according to one embodiment may be formed of metal with a reflective material. The second substrate 160 is arranged on the encapsulation file 140 in a type attached through an adhesive layer 150 to prevent water permeation into the entire surface of the display panel. The second substrate 160 according to one embodiment may be formed to have a larger area than the pixel array layer 130 to effectively prevent water permeation into the entire surface of the light emitting diode.

The adhesive layer 150 is formed to adhere and fix the encapsulation layer 140 and the second substrate 160 to each other. The adhesive layer 150 may perform adhesion using a hardening method of high energy such as heat, ultraviolet, and laser, or a physical pressure using pressure-sensitive adhesive (PSA) material.

The light-transparent film 180 is attached to a rear surface of the first substrate 110 by using a transparent adhesive material as a medium. In this case, the rear surface corresponds to an opposite direction of the front surface. The light-transparent film 180 according to one embodiment may be made of a flexible film, for example, at least one film of a polyethylene terephthalate film, an anti-reflective film, a polarizing film, and a transmittance controllable film. The light-transparent film 180 may be attached to the rear surface of the first substrate 110 separated from the supporting substrate. The transparent adhesive material may be an optically clear resin (OCR) or an optically clear adhesive (OCA). The light-transparent film 180 according to one embodiment is formed to avoid deterioration of visibility due to reflection by metals inside the display panel, and has advantages in improving visibility and in reducing fatigue of a user.

Figure 3:
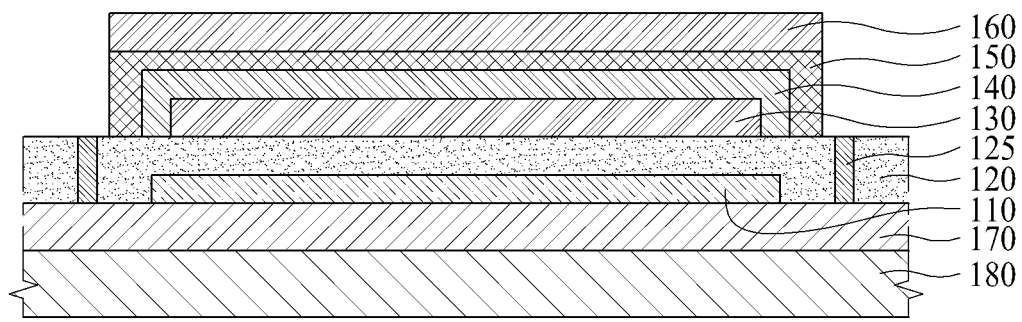
FIG. 3 is cross-sectional view illustrating a display device according to another embodiment of the present disclosure, wherein the display device shown in FIG. 2 additionally includes an inorganic layer.

FIG. 3 is cross-sectional view illustrating a display device according to another embodiment of the present disclosure, wherein the display device shown in FIG. 1 additionally includes an inorganic layer.

Referring to FIG. 3, the display device according to another embodiment of the present disclosure includes an inorganic layer 170 formed on the rear surface of the first substrate 110. Hereinafter, description of elements that are the same as those of FIG. 1 will be not be repeated here to save space for the convenience, but they are the same for FIG. 2, therefore, only properties of the inorganic layer 170 will described.

The inorganic layer 170 is formed on the rear surface of the first substrate 110 and protects the first substrate 110 and the light emitting diode from permeation of external particles, impact, water, and oxygen. The inorganic layer 170 according to one embodiment may be formed of a single layer or a plurality of layers. For example, the inorganic layer 170 may be made of an inorganic insulating material, which enables low temperature deposition, such as a silicon nitride (SiNx), a silicon oxide (SiOx), and an aluminum oxide (AlOx).

The inorganic layer 170 according to one embodiment is formed to prevent defects of the display panel as the first substrate 110 is damaged from external particles, water, etc. after being exposed to the outside when the supporting substrate is separated from the first substrate 110 by delamination during the process of forming the display panel. The inorganic layer 170 is not arranged on the rear surface of the first substrate 110 separately after the display panel is formed, but arranged during the process of forming the display panel. The inorganic film 170 will be described later in more detail.

Figure 4:
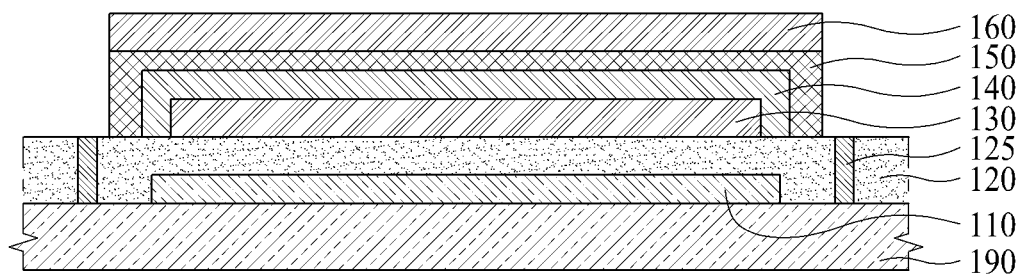
FIG. 4 is a cross-sectional view illustrating a display device according to still another embodiment of the present disclosure, wherein the display device shown in FIG. 2 includes a barrier film instead of a light-transmitting film.

FIG. 4 is a cross-sectional view illustrating a display device according to still another embodiment of the present disclosure, wherein the display device shown in FIG. 2 includes a barrier film instead of a light-transmitting film.

Referring to FIG. 4, the display device according to still another embodiment of the present disclosure include a barrier film 190 attached to the rear surface of the first substrate 110. Hereinafter, description of elements that are the same as those of FIG. 2 will FIG. 2 will not be repeated here to save space for convenience, but they are the same for FIG. 4 and only properties of the barrier film 190 will described.

The barrier film 190 is attached to the rear surface of the first substrate 110 by using a transparent adhesive material as a medium. The barrier film 190 according to one embodiment may be a phase difference film or optically isotropic film. If the barrier film has optically isotropic property, light entering the barrier film 190 is transmitted without a phase delay through the film 190. Also, more inorganic films may be arranged on the upper surface of the barrier film. In this case, the inorganic film may include a silicon nitride (SiNx) and a silicon oxide (SiOx). The inorganic film formed on the upper surface of the barrier film 190 serves to block permeation of external water or oxygen.

Since the barrier film 190 according to one embodiment has properties of excellent water barrier and impact mitigation, the buffer film 190 may prevent the first substrate 110 and the light emitting diode assembly from being damaged. The barrier film 190 includes a liquid moisture absorbing material, and if external water is permeated into the barrier film 190, water particles are combined with the liquid moisture absorbing material and are kept in an empty space in the barrier film 190, whereby the barrier film 190 may have properties of water permeation prevention or water permeation delay.

FIGS. 5A to 5H are cross-sectional views illustrating a method for manufacturing a display device according to one embodiment of the present disclosure. Therefore, the same reference numerals are given to the same elements, and redundant description of the repeated parts regarding elements and structure of each element will be omitted.

Figure 5A:
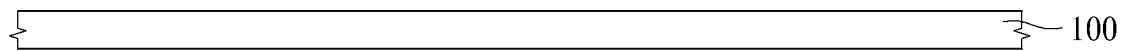
FIGS. 5A to 5H are cross-sectional views illustrating a method for manufacturing a display device according to one embodiment of the present disclosure.

First of all, as shown in FIG. 5A, a process of preparing the supporting substrate 100 is performed. In this case, the supporting substrate 100 serves to securely support a flexible substrate so that a thin flexible substrate is not easily bent or distorted and its shape is fixed during the process of manufacturing the display device. Through such a supporting substrate 100, the flexible substrate may be used easily, and a subsequent process may be performed more precisely and securely. The supporting substrate 100 may be made of a transparent inorganic material such as a plate shaped glass or quartz, which has excellent heat-resistance. Although not shown, the supporting substrate 100 may have a cutting line defined among a plurality of flexible substrates.

Figure 5B:
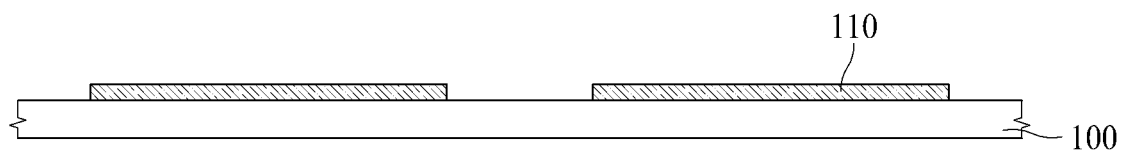

Next, as shown in FIG. 5B, a plurality of the first substrates 110 are formed to be spaced apart from one another on the supporting substrate 100. In this case, the first substrate 110 may be a flexible substrate including plastic materials. Since the first substrates 110 according to one embodiment are not formed on the supporting substrate 100 in a single body but formed to be spaced apart from one another, the cutting process of the first substrate 110 is not required when the display panel is formed through the cutting process. Therefore, the process is more simplified than the related art process that includes two steps of a process of cutting the first substrate 110 and a process of cutting the supporting substrate 100, and defects may be prevented from occurring in the cutting process due to a margin difference between the two processes.

Figure 5C:
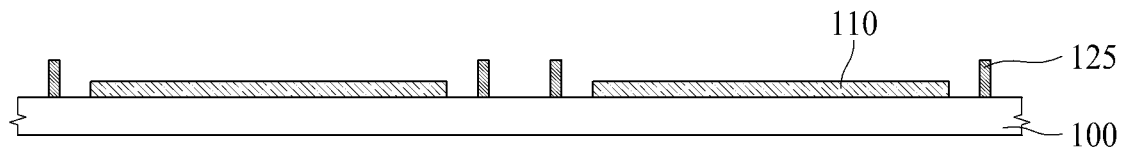

Next, as shown in FIG. 5C, the passivation film 125 is formed on the supporting substrate 100. The passivation film 125 according to one embodiment may be formed to be spaced apart on every side of the first substrate 110 to protect the side of the first substrate 110. The passivation film 125 may serve as a dam that prevents particles such as dust generated in the cutting process for forming the display panel from being permeated into the first substrate 110.

Figure 5D:
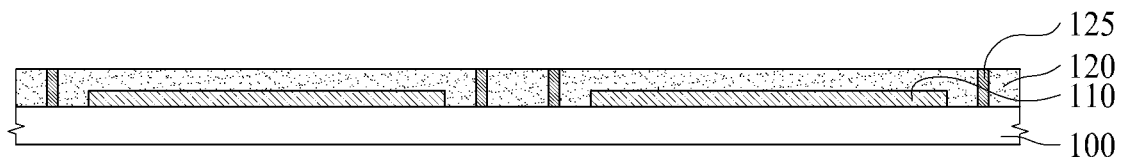

Next, as shown in FIG. 5D, the buffer layer 120 surrounding the front surface and the side of the plurality of the first substrates 110 and the passivation film 125 is formed. The buffer layer 120 according to one embodiment is formed to surround the all sidewalls as well as the front surface of the first substrate 110. Therefore, since all sides of the first substrate 110 is not exposed in the process of cutting the supporting substrate 100 and the buffer layer 120, excitation and side permeability of the first substrate 110 may be minimized. The buffer layer 120 protects the first substrate 110 from external damages together with the passivation film 125.

Each substrate 110 has six sides, a large area front side, a large area back side and four sides, which are the sidewalls that extend from the front side to the back side. As can be appreciate, only four of the sides can be seen in FIG. 5D, the other two sides being located behind and in front of the image shown in FIG. 5D. The buffer layer therefore surrounds the substrate 110 on five sides. In one embodiment, the buffer layer 120 is in contact with five of the six sides of the substrate 110.

Figure 5E:
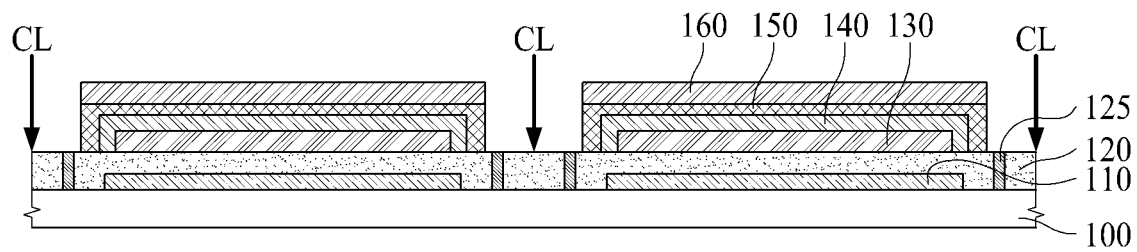

Next, as shown in FIG. 5E, the pixel array layer 130, the encapsulation layer 140, the adhesive layer 150, and the second substrate 160 are sequentially formed on the buffer layer 120. Each of the pixel array layer 130, the encapsulation layer 140, the adhesive layer 150, and the second substrate 160 may be formed on an area overlapped with each of the plurality of first substrates 110. Therefore, each of the pixel array layer 130, the encapsulation layer 140, the adhesive layer 150, and the second substrate 160 is not cut by the cutting process. The second substrate 160 according to one embodiment may be attached to the encapsulation layer 140 by using an adhesive material. Such an adhesive material may be the adhesive layer 150, and is made of resin.

Referring to FIG. 5E again, the supporting substrate 100 and the buffer layer 120 have cutting lines CL defined among the plurality of the first substrates 110. The cutting lines CL are lines arranged among the plurality of the first substrates 110 to form a plurality of display panels, and a display panel cell cutting process is performed along the cutting lines CL.

Figure 5F:
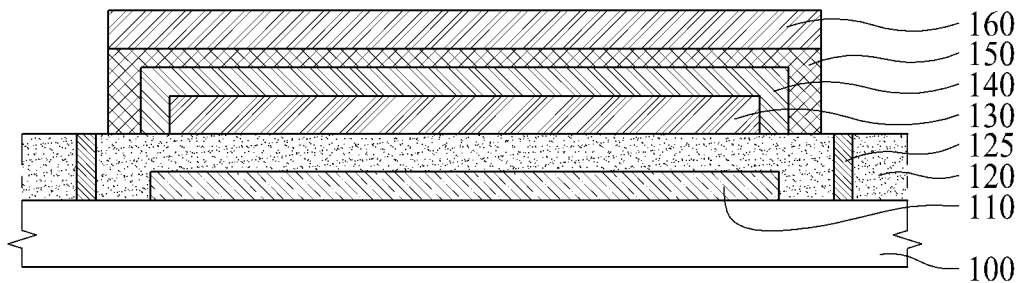

Next, as shown in FIGS. 5E and 5F, a display panel on a cell basis is formed by cutting the supporting substrate 100 and the buffer layer 120 based on the cutting line. As described above, since the display panel according to one embodiment does not permit permeation of water and particles into the first substrate 110 in the cutting process, the display panel having very few or no defects may be more easily obtained through the process according to one embodiment.

Figure 5G:
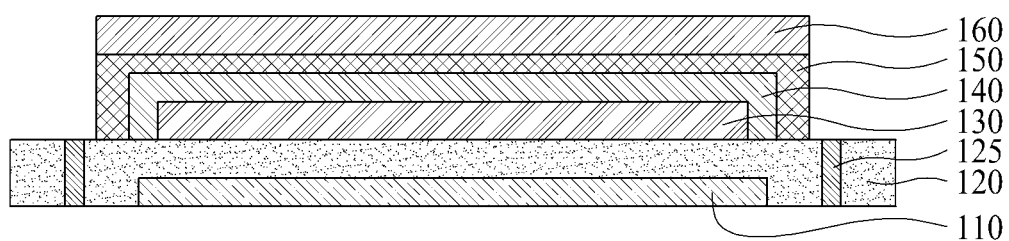

Next, as shown in FIG. 5G, the first substrate 110 formed on the supporting substrate 100 is separated from the supporting substrate 100. One technique to separate the supporting substrate 100 is through a delamination process. One way to carry out a delamination process is to have a laser beam irradiated on a silicon film provided on the supporting substrate 100 and heat treatment is subjected to the silicon film and then the heat-treated silicon film is subjected to dehydrogenation. Through this process, the first substrate 110 may be separated from the supporting substrate 100. There are other ways that the supporting substrate 100 can be removed from the first substrate 110 that are acceptable.

Figure 5H:
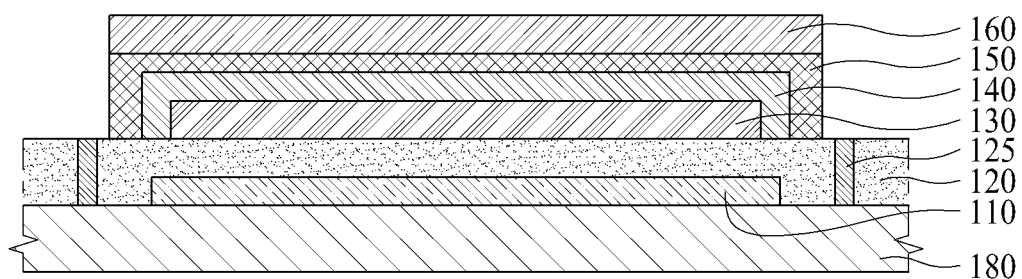

Next, as shown in FIG. 5H, the light-transmitting film 180 is attached to the rear surface of the first substrate 110 separated from the supporting substrate 100. The light-transmitting film 180 may be attached to the rear surface of the first substrate 110 by a transparent adhesive material. The light-transmitting film 180 according to one embodiment is attached to the rear surface of the first substrate separated from the supporting substrate 100 to avoid deterioration of visibility due to reflection by metals inside the display panel, and has an advantage in protecting the rear surface of the first substrate 110 from the outside.

As described above, as the display device is manufactured in accordance with the method for manufacturing the display device according to one embodiment of the present disclosure, the conventional cutting process of the first substrate 110 does not occur. Instead, the supporting substrate 100 is cut. Further, there is a passivation film 125 positioned between the cutting location and the first substrate 110. Any debris, impurities, or defects that might occur because of the cutting of substrate 110 are avoided completely since that substrate is not cut. Further, any debris, impurities or defects that might be cause by cutting the supporting substrate 100 and the buffer layer 120 are isolated from the first substrate 100 by three layers, a first portion of the buffer layer 120, a section of the passivation film 125 and then another section of the buffer layer 120.

Further, at the time the cutting is carried out, the first substrate 110 is is surrounded on all sides. It is surrounded on five sides by the buffer layer and on one side by the support substrate. Thus, any debris or impurities that might be created by the cutting step of blocked from being able to enter the first substrate 110. With this process, the number of entire processes and time for production may be reduced, and defects in the cutting process due to a margin difference between the cutting process of the supporting substrate 100 and the cutting process of the first substrate 110 may be prevented from occurring. Also, since a crack and damage that may occur in the conventional cutting process in which the the first substrate 110 is cut can be avoided by not even cutting the first substrate 110, a display panel with a low defect ratio and an improved yield may be formed.

Also, since the buffer layer covering the front surface and four other sides of the plurality of the first substrates 110 formed on the supporting substrate 100, the side of the first substrate 110 is not exposed to the outside during the cutting process, whereby excitation and permeability of the first substrate 100 may be minimized. Therefore, entire permeability of the display panel is avoided, reliability of the display panel may be improved.

In addition, during the cutting process, the pixel array layer 130 is also surrounded on all sides. The the pixel array layer 130 is surrounded on five sides by the encapsulation layer 140 and on the back side by the buffer layer 120.

FIGS. 6A to 6H are cross-sectional views illustrating a method for manufacturing a display device according to another embodiment of the present disclosure. Those steps of forming the structure of FIGS. 6A-6H which are common the to the steps of FIGS. 5A-5H are not repeated here.

Referring to FIGS. 6A to 6E, the inorganic layer 170 is formed on the supporting substrate 100, and a plurality of first substrates 110 are formed on the inorganic layer 170. The inorganic layer 170 is formed in a single body unlike the plurality of first substrates 110. This is to allow the inorganic layer 170 having a width greater than the first substrate 110 to protect the rear surface of the first substrate 110 from the outside even if the supporting substrate 100 is separated later through the cutting process and the delamination process.

The inorganic layer 170 according to one embodiment serves to protect the first substrate 110 by being formed on the supporting substrate 100 in advance before the first substrate 110 is formed to prevent the first substrate 110 from being damaged from external particles and water when the first substrate 110 is separated from the supporting substrate 100.

Therefore, the inorganic layer 170 is formed on the supporting substrate 100, the plurality of first substrates are formed on the inorganic layer 170, and the buffer layer 120, the pixel array layer 130, the encapsulation layer 140, the adhesive layer 150, and the second substrate 160 are sequentially formed on the plurality of first substrates 110.

Referring to FIG. 6E again, the supporting substrate 100, the inorganic layer 170, and the buffer layer 120 are cut based on the cutting lines CL defined among the plurality of first substrates 110. Since the inorganic layer 170 is cut along with the supporting substrate 100 and the buffer layer 120 after being formed in a single body, the inorganic layer 170 may have a larger width than the first substrate 110 and later protect the rear surface of the first substrate 110 from the outside even when the supporting substrate 100 is separated.

Figure 6A:
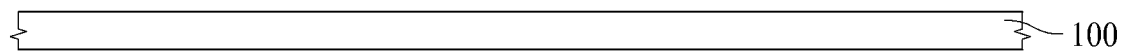
FIGS. 6A to 6H are cross-sectional views illustrating a method for manufacturing a display device according to another embodiment of the present disclosure.
Figure 6B:
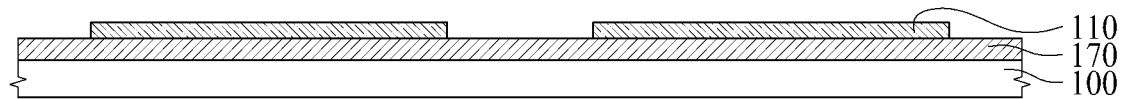
Figure 6C:
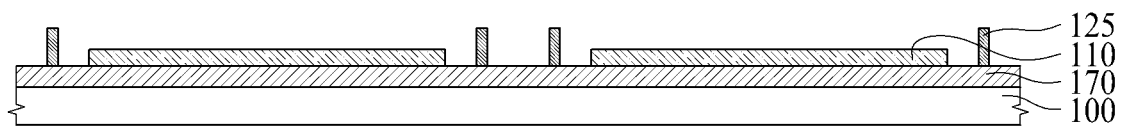
Figure 6D:
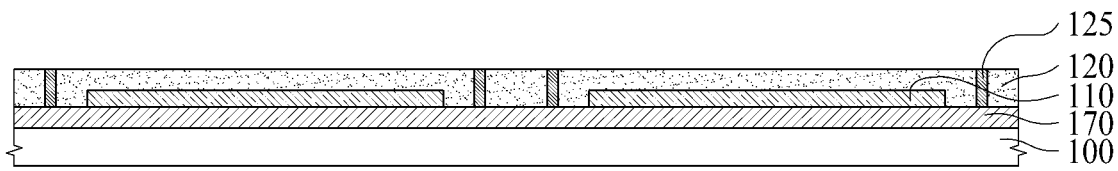
Figure 6E:
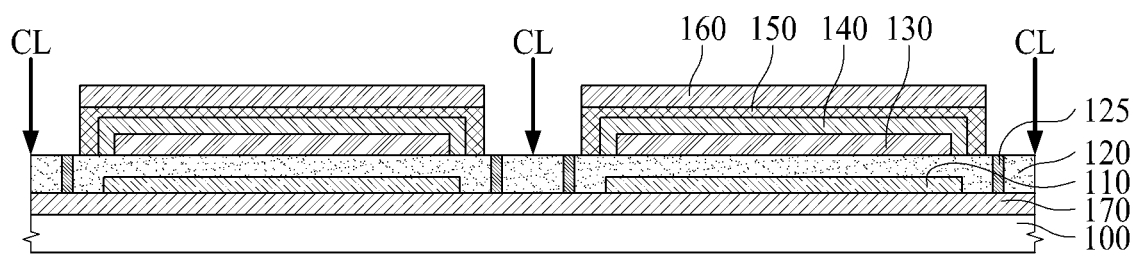
Figure 6F:
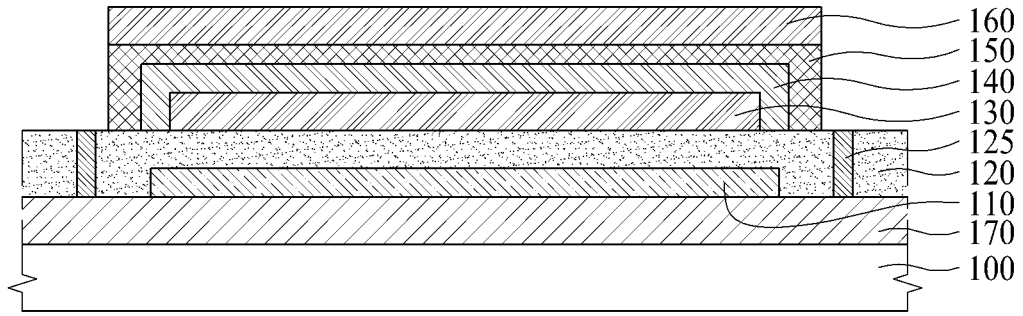
Figure 6G:
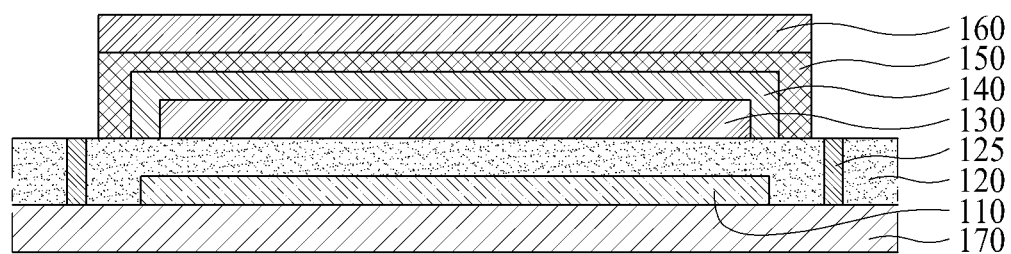
Figure 6H:
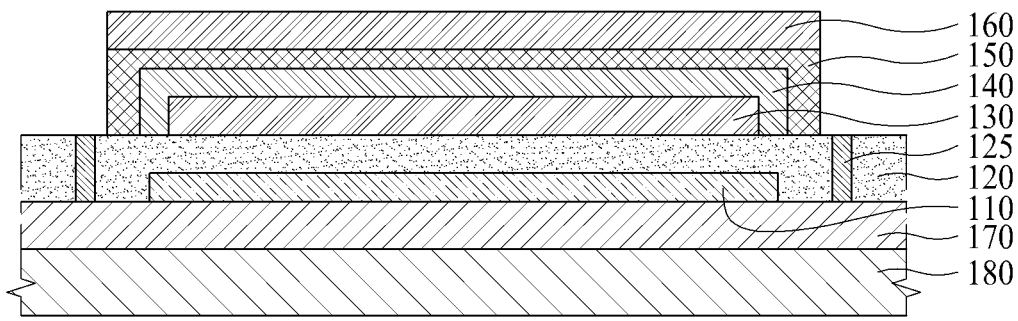

Referring to FIGS. 6F to 6H, the light-transmitting film 180 is attached to the rear surface of the inorganic layer 170 from which the supporting substrate 100 is separated. The light-transmitting film 180 may be attached to the rear surface of the inorganic layer 170 by using a transparent adhesive material. The light-transmitting film 180 according to one embodiment may avoid deterioration of visibility and have an advantage in protecting the rear surface of the first substrate 110 from the outside like the inorganic layer 170.

FIGS. 7A to 7H are cross-sectional views illustrating a method for manufacturing a display device according to other embodiment of the present disclosure. Since a barrier film is attached in method of making FIGS. 7A to 7H instead of the light-transmitting film that is used in the method for manufacturing the display panel according to FIGS. 5A to 5H, description repeated from FIGS. 5A to 5H will be omitted, and only the differences in the process will be described.

Referring to FIGS. 7A to 7G, up to the process of separating the supporting substrate 100, the process is the same as that of FIGS. 5A to 5G. Therefore, repeated descriptions regarding this will be omitted.

Figure 7A:
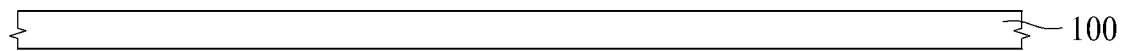
FIGS. 7A to 7H are cross-sectional views illustrating a method for manufacturing a display device according to another embodiment of the present disclosure.
Figure 7B:
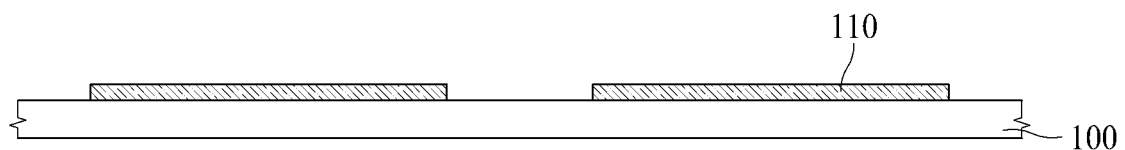
Figure 7C:
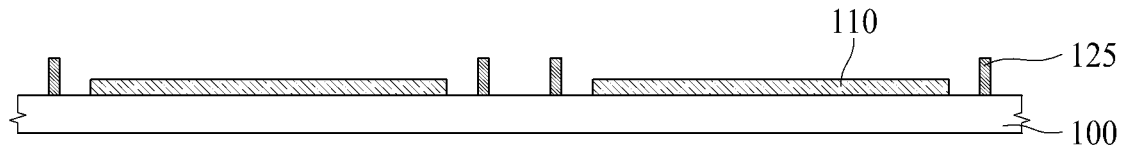
Figure 7D:
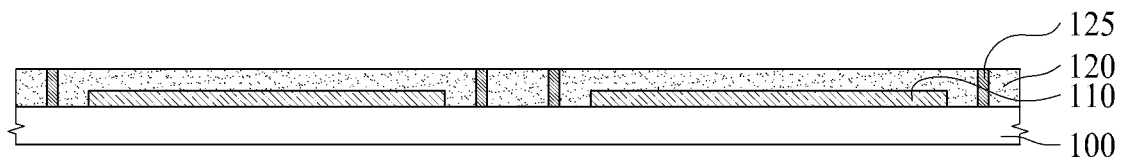
Figure 7E:
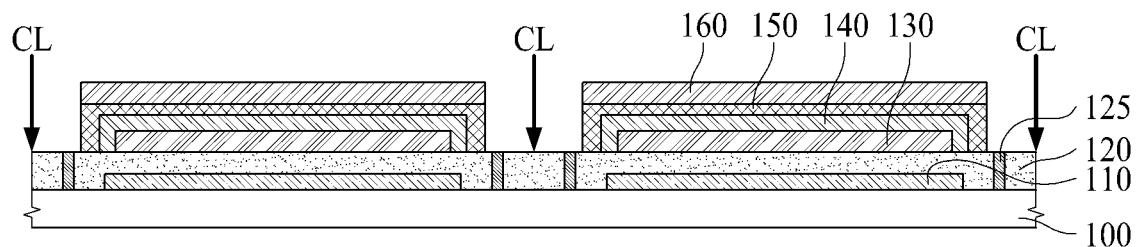
Figure 7F:
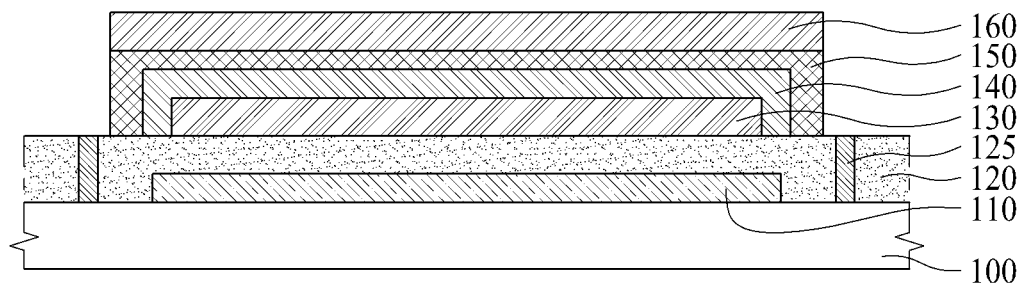
Figure 7G:
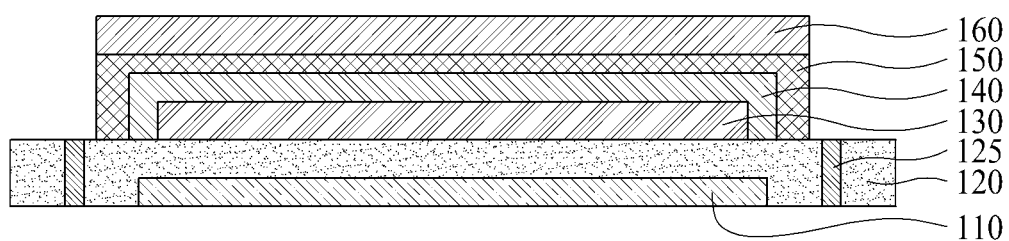
Figure 7H:
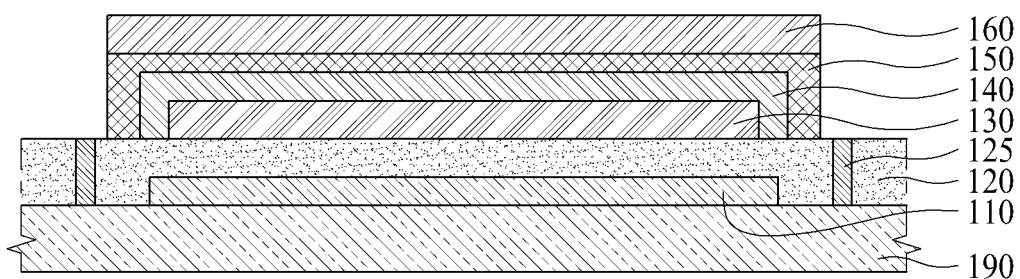

Referring to FIG. 7H, the barrier film 190 is attached to the rear surface of the first substrate 110 separated from the supporting substrate 100. The barrier film 190 is attached the rear surface of the first substrate 110 using a transparent adhesive material. Since the barrier film 190 according to one embodiment has properties of excellent water barrier and impact mitigation, damage of the first substrate 110 may be avoided. Also, an additional inorganic film may be arranged on the upper surface of the barrier film. The inorganic film serves to block permeation of external water or oxygen, and may be attached to the rear surface of the first substrate 110 using a transparent adhesive material. If the barrier film 190 according to one embodiment includes an inorganic film, an effect of preventing water permeation into the first substrate 110 may be improved, and reliability of the display panel may be improved.

As described above, the display device according to the present disclosure has the following advantages.

The display device according to the present disclosure has an advantage in preventing the defect of the display panel by minimizing excitation and side permeability of the first substrate.

Also, the display device according to the present disclosure has an advantage in improving reliability and reducing costs for production by preventing defects of the display panel from occurring.

Also, the display device according to the present disclosure has an advantage in simplifying a module process and improving yield by omitting the process of cutting the first substrate.

It will be appreciated by persons skilled in the art that that the advantageous effects that can be achieved through the present disclosure are not limited to what has been particularly described hereinabove and other advantages of the present disclosure will be more clearly understood from the aforementioned detailed description.

It will be apparent to those skilled in the art that various modifications and variations can be made in the present disclosure without departing from the spirit or scope of the disclosures. Thus, it is intended that the present disclosure covers the modifications and variations of this disclosure provided they come within the scope of the appended claims and their equivalents.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

What is claimed is:

1. A display device comprising:
a first substrate;
a buffer layer positioned on the first substrate, the buffer layer having a first portion in direct contact with a front surface of the first substrate and in contact with a side surface of the first substrate and a second portion spaced laterally apart from the first portion of the buffer layer;
a passivation film positioned laterally away from the first substrate and located between the first portion of the buffer layer and the second portion of the buffer layer;
a pixel array layer positioned on and directly contacting the buffer layer; and
an encapsulation layer covering the pixel array layer,
wherein the first portion of the buffer layer surrounds the front surface and the side surface of the first substrate, and
wherein the first portion of the buffer layer, the second portion of the buffer layer, and the passivation film have a same height.

2. The display device of claim 1, further comprising a second substrate attached on the encapsulation layer.

3. The display device of claim 1, wherein the passivation film is formed at the side of the first substrate, and wherein the buffer layer surrounds at least two sides of the passivation film.

4. The display device of claim 1, further comprising a light-transmitting film attached to a rear surface of the first substrate.

5. The display device of claim 1, further comprising an inorganic layer formed on a rear surface of the first substrate.

6. The display device of claim 5, further comprising a light-transmitting film attached on a rear surface of the inorganic layer.

7. The display device of claim 1, further comprising a barrier film attached to a rear surface of the first substrate.

8. The display device of claim 7, wherein the barrier film includes at least one of a phase difference film or an optically isotropic film.

9. A display device comprising:
   a substrate having a front surface and a side surface;
   a buffer layer positioned on the substrate, the buffer layer having a first portion that surrounds the front surface and the side surface of the substrate and a second portion spaced laterally apart from the side surface of the substrate and from the first portion of the buffer layer;
   a passivation film positioned laterally to the side of the substrate and between the first portion of the buffer layer and the second portion of the buffer layer;
   a pixel array layer positioned on and directly contacting the buffer layer; and
   an encapsulation layer covering the pixel array layer,
   wherein the first portion of the buffer layer, the second portion of the buffer layer, and the passivation film have a same height, the first portion of the buffer layer in direct contact with the front surface.

10. The display device of claim 9, further comprising a second substrate attached on the encapsulation layer.

11. The display device of claim 9, further comprising a light-transmitting film attached to a rear surface of the substrate.

12. The display device of claim 9, further comprising an inorganic layer formed on a rear surface of the substrate.

13. The display device of claim 12, further comprising a light-transmitting film attached on a rear surface of the inorganic layer.

14. The display device of claim 9, further comprising a barrier film attached to a rear surface of the substrate.

15. The display device of claim 14, wherein the barrier film includes at least one of a phase difference film or an optically isotropic film.

\* \* \* \* \*